United States Patent
Kinoshita et al.

(10) Patent No.: US 9,842,905 B2
(45) Date of Patent: Dec. 12, 2017

(54) SEMICONDUCTOR DEVICE AND METHOD FOR FABRICATING THE SAME

(71) Applicant: PANASONIC CORPORATION, Osaka (JP)

(72) Inventors: Yusuke Kinoshita, Kyoto (JP); Satoshi Tamura, Osaka (JP); Yoshiharu Anda, Osaka (JP); Tetsuzo Ueda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 201 days.

(21) Appl. No.: 14/107,758

(22) Filed: Dec. 16, 2013

(65) Prior Publication Data
US 2014/0103459 A1    Apr. 17, 2014

Related U.S. Application Data

(63) Continuation of application No. PCT/JP2012/003435, filed on May 25, 2012.

(30) Foreign Application Priority Data

Jul. 15, 2011 (JP) ................................ 2011-156969

(51) Int. Cl.
*H01L 29/49* (2006.01)
*H01L 29/66* (2006.01)
(Continued)

(52) U.S. Cl.
CPC .......... *H01L 29/49* (2013.01); *H01L 29/1066* (2013.01); *H01L 29/2003* (2013.01);
(Continued)

(58) Field of Classification Search
CPC ............... H01L 29/778; H01L 29/7786; H01L 29/7787; H01L 29/2003; H01L 29/66462;
(Continued)

(56) References Cited

U.S. PATENT DOCUMENTS 5,923,072 A * 7/1999 Wada ................ H01L 21/28581
257/192
7,816,707 B2 * 10/2010 Hikita ................ H01L 29/7783
257/192
(Continued)

FOREIGN PATENT DOCUMENTS

EP    0301862 A2   2/1989
JP    62-281476 A  12/1987
(Continued)

OTHER PUBLICATIONS

Kawasaki et al., "Normally-off AlGaN/GaN HEMT with Recessed Gate for High Power Applications," Extended Abstracts of the 2005 International Conference on Solid State Devices and Materials, Kobe, 2005, pp. 206-207.
(Continued)

*Primary Examiner* — Cheung Lee
*Assistant Examiner* — Stephen C Smith
(74) *Attorney, Agent, or Firm* — McDermott Will & Emery LLP

(57) ABSTRACT

A semiconductor device includes: a channel layer made of GaN; a barrier layer formed on the channel layer, the bather layer being made of AlGaN and having a larger band gap than the channel layer; a p-type GaN layer selectively formed on the barrier layer; a gate electrode made of ITO on the p-type GaN layer; and a source electrode and a drain electrode on regions of the barrier layer laterally outward of the gate electrode. The width of the gate electrode in the gate length direction is smaller than or equal to the width of the p-type GaN layer in the gate length direction, and the difference between the width of the gate electrode in the gate length direction and the width of the p-type GaN layer in the gate length direction is less than or equal to 0.2 μm.

3 Claims, 11 Drawing Sheets

(51) Int. Cl.
| | |
|---|---|
| *H01L 29/423* | (2006.01) |
| *H01L 29/78* | (2006.01) |
| *H01L 29/808* | (2006.01) |
| *H01L 29/20* | (2006.01) |
| *H01L 29/778* | (2006.01) |
| *H01L 29/10* | (2006.01) |

(52) U.S. Cl.
CPC .. *H01L 29/42316* (2013.01); *H01L 29/66446* (2013.01); *H01L 29/66462* (2013.01); *H01L 29/66893* (2013.01); *H01L 29/66924* (2013.01); *H01L 29/7787* (2013.01); *H01L 29/78* (2013.01); *H01L 29/808* (2013.01)

(58) Field of Classification Search
CPC ............... H01L 29/04; H01L 29/1006; H01L 29/42316; H01L 29/66446; H01L 29/66893; H01L 29/66924; H01L 29/78; H01L 29/808
See application file for complete search history.

(56) References Cited

U.S. PATENT DOCUMENTS

| | | | | |
|---|---|---|---|---|
| 8,076,698 B2* | 12/2011 | Ueda | ...................... | H01L 29/739 257/194 |
| 8,164,115 B2* | 4/2012 | Hikita | ................. | H01L 29/1066 257/192 |
| 8,264,002 B2* | 9/2012 | Hikita | ................. | H01L 29/7783 257/192 |
| 8,436,398 B2* | 5/2013 | Lidow | ................. | H01L 29/1066 257/189 |
| 8,592,866 B2* | 11/2013 | Yanagihara | ......... | H01L 29/1066 257/194 |
| 2005/0110054 A1* | 5/2005 | Wohlmuth | ........ | H01L 21/82345 257/267 |
| 2005/0189559 A1 | 9/2005 | Saito et al. | | |
| 2007/0176215 A1* | 8/2007 | Yanagihara | ......... | H01L 29/1066 257/288 |
| 2008/0079023 A1* | 4/2008 | Hikita | ................. | H01L 29/1066 257/192 |
| 2008/0121934 A1* | 5/2008 | Matsuda | ............. | H01L 29/2003 257/192 |
| 2008/0173898 A1 | 7/2008 | Ohmaki | | |
| 2010/0072516 A1 | 3/2010 | Tamura et al. | | |
| 2010/0163928 A1* | 7/2010 | Imada | ................. | H01L 29/0619 257/194 |
| 2010/0258841 A1* | 10/2010 | Lidow | ................. | H01L 29/1066 257/192 |
| 2011/0049571 A1* | 3/2011 | Miyoshi | ............. | H01L 29/2003 257/192 |
| 2012/0061729 A1* | 3/2012 | Shibata | ............. | H01L 29/66462 257/194 |
| 2012/0119261 A1 | 5/2012 | Umeda et al. | | |
| 2013/0015466 A1* | 1/2013 | Miyoshi | ............. | H01L 21/0237 257/76 |
| 2014/0091316 A1* | 4/2014 | Kikkawa | ........... | H01L 29/66462 257/76 |

FOREIGN PATENT DOCUMENTS

| | | |
|---|---|---|
| JP | 08-055861 A | 2/1996 |
| JP | 09-008356 A | 1/1997 |
| JP | 2005-244072 A | 9/2005 |
| JP | 2007-066979 A | 3/2007 |
| JP | 2010-258313 A | 11/2010 |
| WO | 2011/067903 A1 | 6/2011 |

OTHER PUBLICATIONS

Kuroda et al., "Normally-off Operation of Non-polar AlGaN/GaN Heterojunction FETs Grown on R-plane Sapphire," Extended Abstracts of the 2005 International Conference on Solid State Devices and Materials, Kobe 2005, pp. 470-471.

International Search Report issued in International Application No. PCT/JP2012/003435, dated Aug. 28, 2012, with English translation, 8 pgs.

* cited by examiner

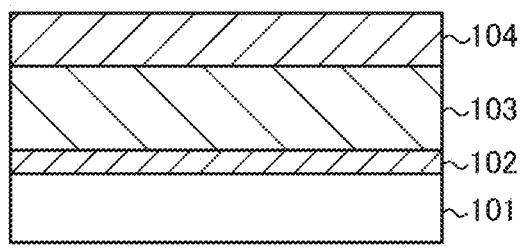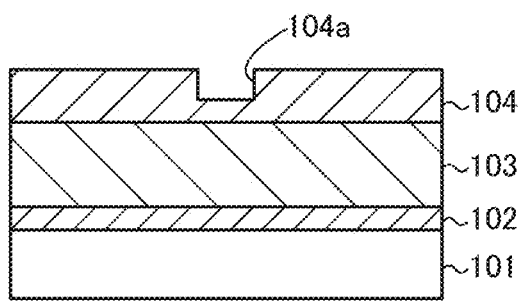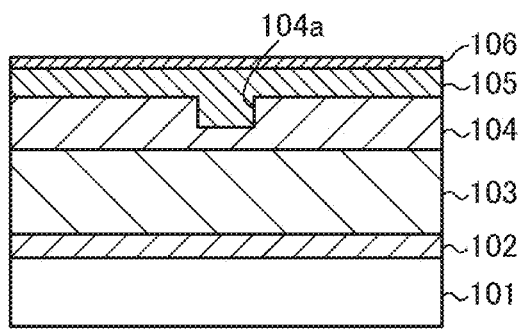

SEMICONDUCTOR DEVICE AND METHOD FOR FABRICATING THE SAME

CROSS-REFERENCE TO RELATED APPLICATIONS

This is a continuation of International Application No. PCT/JP2012/003435 filed on May 25, 2012, which claims priority to Japanese Patent Application No. 2011-156969 filed on Jul. 15, 2011. The entire disclosures of these applications are incorporated by reference herein.

BACKGROUND

The present disclosure relates to semiconductor devices and methods for fabricating the same, and specifically to a field-effect semiconductor device using a nitride semiconductor and a method for fabricating the same.

In recent years, field-effect transistors (FETs) using a gallium nitride (GaN)-based semiconductor material have been actively researched as power devices.

Since a nitride semiconductor material such as GaN can form various alloy crystals with aluminum nitride (AlN), indium nitride (InN), etc., the nitride semiconductor material can form a hetero junction similar to a conventional arsenic-based semiconductor material such as gallium arsenide (GaAs). In particular, a hetero junction of a nitride semiconductor has the feature that even when the nitride semiconductor is undoped, highly-concentrated carriers are generated at a hetero junction interface due to spontaneous polarization or piezo-polarization. As a result, when a FET is made of nitride semiconductor, the FET is more likely to be depletion type (normally-on type), and thus it is difficult to obtain enhancement type (normally-off type) characteristics. However, most devices currently available in power electronics markets are normally-off type, and there is thus a strong need also for normally-off type GaN-based nitride semiconductor devices.

Normally off-type transistors have, for example, a configuration in which the threshold voltage of a gate is shifted to have a positive value by burying a gate formation region (see, for example, T. Kawasaki et al., Solid State Devices and Materials 2005 tech. digest p. 206), or are fabricated by, for example, a method that includes forming a FET on the (10-12) plane, which is a plane orientation of a crystal plane in a substrate made of sapphire, to prevent generation of a polarization electric field in a direction of crystal growth of the nitride semiconductor (see, for example, M. Kuroda et al., Solid State Devices and Materials 2005 tech. digest p. 470). Here, for the sake of convenience, a minus sign "−" attached to each miller index of the plane orientation indicates inversion of an index following the minus sign.

Moreover, as a promising structure for achieving a normally-off FET, a junction field-effect transistor (JFET) including a p-type GaN layer formed in a gate formation region has been proposed (see, for example, Japanese Unexamined Patent Publication No. 2005-244072).

In the JFET, piezo-polarization occurring at a first hetero junction between a channel layer made of undoped GaN and a barrier layer made of undoped AlGaN is canceled by another piezo-polarization occurring at a second hetero junction between a barrier layer made of AlGaN and a p-type GaN layer on the bather layer made of AlGaN. This can selectively reduce the two-dimensional electron gas concentration directly under the gate formation region where the p-type GaN layer is formed, so that the JFET can have normally-off characteristics. Moreover, by using for a gate electrode, a pn junction having a higher built-in potential than a Schottky junction between metal and a semiconductor, a rising voltage of the gate can be increased. This provides advantages that a gate leakage current can be reduced even when a positive gate voltage is applied.

FIG. 12 illustrates a cross-sectional structure of a JFET as a first conventional example, where a p-type GaN layer is provided in a gate formation region.

As illustrated in FIG. 12, a buffer layer 2 made of aluminum nitride (AlN), a channel layer 3 made of undoped gallium nitride (GaN), a bather layer 4 made of undoped aluminum gallium nitride (AlGaN), and a p-type GaN layer 5 are sequentially formed on a substrate 1 made of, for example, silicon (Si). Note that the undoped nitride semiconductor means a nitride semiconductor into which impurities determining the conductivity type are not implanted on purpose.

A gate electrode 7 made of palladium (Pd) is selectively formed on the p-type GaN layer 5. Here, the p-type GaN layer 5 has been removed except a portion of the p-type GaN layer 5 under and on both sides of the gate electrode 7. A source electrode 8 and a drain electrode 9 which are made of Ti/Al are formed on the barrier layer 4, the source electrode 8 and the drain electrode 9 being spaced apart from the p-type GaN layer 5.

FIGS. 13A-13E illustrates a method for fabricating the JFET according to the first conventional example.

First, as illustrated in FIG. 13A, a buffer layer 2 made of AlN, a channel layer 3 made of undoped GaN, a bather layer 4 made of undoped AlGaN, and a p-type GaN layer 5 are sequentially formed on a substrate 1 by molecular beam epitaxy or metal organic chemical vapor deposition.

Next, as illustrated in FIG. 13B, a resist film 10 patterned to have a predetermined size as a gate formation region is formed on the p-type GaN layer 5.

Then, as illustrated in FIG. 13C, using the patterned resist film 10 as a mask, dry etching is performed on the p-type GaN layer 5 to remove the p-type GaN layer 5 except a portion of the p-type GaN layer 5 in a gate formation region.

Then, a resist film (not shown) which has an opening pattern exposing formation regions for a source electrode and a drain electrode is formed on the p-type GaN layer 5, and a Ti layer and an Al layer are stacked on the resist film. Thereafter, unnecessary portions of the stacked metal layers are removed together with the resist film by a lift-off method, thereby obtaining a source electrode 8 and a drain electrode 9 as illustrated in FIG. 13D. After that, the Ti/Al layer is alloyed in an infrared ray alloying furnace or a heater alloying furnace.

Next, a resist film (not shown) which has a gate pattern as an opening pattern is formed on the p-type GaN layer 5. Then, a Pd layer is formed on the resist film having the gate pattern. Subsequently, an unnecessary portion of the Pd layer is removed together with the resist film by a lift-off method, thereby completing a JFET as illustrated in FIG. 13E.

In the first conventional example, if it is possible to form the gate electrode 7 and the source electrode 8 or the drain electrode 9 close to each other, that is, if the device size can be reduced, the channel length is reduced, so that the channel resistance (source resistance) decreases. Therefore, it is also possible to increase transconductance. Additionally, the reduction in device size can increase the number of devices obtained per area.

Incidentally, in the method for fabricating the JFET according to the first conventional example as illustrated in FIG. 13D, the width of the p-type GaN layer 5 in a gate length direction has to be sufficiently large compared to the width of the gate electrode 7 in the gate length direction. The term "sufficiently large" means a size allowing formation of the gate electrode 7 with high precision while preventing the gate electrode 7 from slipping down from an upper surface of the p-type GaN layer 5. When the gate electrode 7 slips down from the p-type GaN layer 5, the gate leakage current is significantly increased. Specifically, the width of the p-type GaN layer 5 in the gate length depends on the mask alignment accuracy in a stepper device. When a general i-line stepper device is used, the width of the p-type GaN layer 5 is preferably greater than the width of the gate electrode 7 by about 1 μm.

Moreover, it is not preferable that the p-type GaN layer 5 come into contact with the source electrode 8 or the drain electrode 9 because also in this case, the gate leakage current increases.

Thus, in the fabrication method according to the first conventional example, the p-type GaN layer 5 requires a further width in addition to the width of the gate electrode 7. For this reason, the source electrode 8 and the drain electrode 9 are necessarily formed with a required distance from side surfaces of the p-type GaN layer 5. That is, the distance between the gate electrode 7 and the source electrode 8 or the drain electrode 9 is extra long, which is a problem in terms of reduction in size of the semiconductor device.

As an example solution of the above-described problem related to the reduction in size includes a method for dry-etching the p-type GaN layer by using the gate electrode as a mask in a self-alignment manner (see, for example, Japanese Unexamined Patent Publication No. S62-281476).

FIG. 14 illustrates a cross-sectional configuration of a JFET formed in self-alignment manner as a second conventional example. As illustrated in FIG. 14, n$^+$-type source/drain regions 12 are formed on the semiconductor substrate 11 with an n-type channel region 13 provided between the n$^+$-type source/drain regions 12. A p$^+$-type gate region 14 and a gate electrode 15 on the p$^+$-type gate region 14 are sequentially formed between the source/drain regions 12 and on the channel region 13. Moreover, a source electrode 16 is formed on one of the source/drain regions 12, and a drain electrode 17 is formed on the other of the source/drain regions 12.

As described above, with self alignment, the width of the gate electrode 15 and the width of the gate region 14 which is the p$^+$-type conductive layer can be equal to each other in the gate length direction, so that the size of the semiconductor device can be reduced.

SUMMARY

The inventors of the present application fabricated a JFET made of a nitride semiconductor according to the steps in the fabrication method illustrated in FIG. 13, and confirmed a phenomenon which is so-called current collapse in which the drain current decreases when a high drain voltage is applied. The current collapse is well known as a problem specific to an FET using a nitride semiconductor.

The present inventors have conducted various studies to find causes of the current collapse of the formed JFET, and have found that one of the causes is damage to the vicinity of a surface of a nitride semiconductor layer by dry etching performed to pattern the p-type GaN layer.

Moreover, the present inventors found that performing high temperature annealing after the step of etching the p-type GaN layer in FIG. 13C is advantageous in order to reduce the current collapse, in other words, in order to reduce damage to the surface of the nitride semiconductor layer.

However, in the JFET formed with self alignment allowing the reduction in size of the device according to the second conventional example as illustrated in FIG. 14, metal included in the gate electrode is provided on the p-type conductive layer after the p-type conductive layer is patterned. Thus, the high temperature annealing can be performed only when the gate electrode is made of a metal having a high resistance to heat in terms of reliability.

When nickel (Ni) or palladium (Pd), which is well known as a gate electrode material of a FET made of a nitride semiconductor, is formed to have a thickness of, for example, 100 nm, a problem arises where annealing at a temperature higher than or equal to 600° C. causes peeling off of the electrode or significant degradation of contact resistance.

In view of the above problems, it is an objective of the present disclosure to provide a normally-off type nitride semiconductor device including a gate electrode under which a p-type conductive layer is provided, wherein the limitation on reduction of size of the device can be reduced and, the current collapse can be reduced.

To achieve the objective, a semiconductor device and method for fabricating the same according to the present disclosure are formed by patterning a p-type conductive layer disposed under the gate electrode in a self-alignment manner by the gate electrode, and performing high temperature annealing is performed after the patterning.

Specifically, a semiconductor device according to the present disclosure includes: a first nitride semiconductor layer including a channel region; a second nitride semiconductor layer formed on the first nitride semiconductor layer, the second nitride semiconductor layer having a larger band gap than the first nitride semiconductor layer; a third nitride semiconductor layer selectively formed on the second nitride semiconductor layer, the third nitride semiconductor layer having a p-type conductivity; a gate electrode formed on the third nitride semiconductor layer, the gate electrode being made of a refractory material; and a source electrode and a drain electrode formed on regions of the second nitride semiconductor layer laterally outward of the gate electrode, wherein a width of the gate electrode in a gate length direction is smaller than or equal to a width of the third nitride semiconductor layer in the gate length direction, and a difference between the width of the gate electrode in the gate length direction and the width of the third nitride semiconductor layer in the gate length direction is less than or equal to 0.2 μm.

Here, a refractory material means a material having a melting point higher than the melting point (660° C.) of aluminum (Al) which is a material generally used for source electrodes and drain electrodes of nitride-based semiconductors.

In the semiconductor device of the present disclosure, the difference between the width of the gate electrode in the gate length direction and the width of the third nitride semiconductor layer in the gate length direction is less than or equal to 0.2 μm. With this configuration, the third nitride semiconductor layer selectively formed under the gate electrode can be disposed without being remote from the source electrode or the drain electrode, so that it is possible to reduce channel resistance. Moreover, since the gate electrode is made of a refractory material, high temperature annealing can be performed without breaking the gate electrode, so that it is possible to reduce the current collapse.

In the semiconductor device of the present disclosure, the gate electrode may be made of at least a material selected from the group consisting of tungsten silicide ($W_xSi_{1-x}$), rhenium silicide ($Re_xSi_{1-x}$), tantalum silicide ($Ta_xSi_{1-x}$), osmium silicide ($Os_xSi_{1-x}$), molybdenum silicide ($Mo_xSi_{1-x}$), where $0 \leq x \leq 1$, and indium tin oxide (ITO).

With this configuration, since these electrode materials are materials having a high adhesiveness, peeling off of the gate electrode can be further reduced.

In the semiconductor device of the present disclosure, the gate electrode may be made of at least a metal selected from the group consisting of tungsten (W), rhenium (Re), tantalum (Ta), osmium (Os), and molybdenum (Mo).

With this configuration, since these electrode materials are materials having a particularly high resistance to heat among the refractory metal materials, and having a particularly high melting point of 2500° C. or higher, it is possible to further reduce the breaking down of the gate electrode in high temperature annealing.

In the semiconductor device of the present disclosure, the gate electrode may have an upper portion including a metal layer made of gold or an alloy containing gold.

With this configuration, since gold (Au) has a lower resistance than the electrode material described above, it is possible to reduce gate resistance. Moreover, since Au has a high resistance to etching by a chlorine ($Cl_2$) gas or a fluorine ($F_2$) gas in performing dry etching on the p-type third nitride semiconductor layer, it possible to reduce deformation of the gate electrode due to etching.

In the semiconductor device of the present disclosure, the gate electrode may have a lower portion being in contact with the third nitride semiconductor layer, and including a first metal layer, the first metal layer having a thickness of 20 nm or less and being made of palladium or an alloy containing palladium.

Palladium (Pd) is a material which easily establishes Ohmic contact with the p-type third nitride semiconductor layer and can reduce contact resistance. However, when Pd has a thickness of 20 nm or greater, the Pd film is easily peeled off at an annealing temperature of higher than or equal to 650° C., and the contact resistance is easily degraded. Therefore, when palladium or an alloy thereof having a thickness of 20 nm or less is used in a lower portion of the gate electrode, the contact resistance of the gate electrode can be stably reduced. Note that an alloy containing Pd means an alloy containing Pd as an element constituting the electrode, and includes a mixture in which a part of Pd is not alloyed.

In this case, the gate electrode may have an upper portion including a second metal layer made of gold or an alloy containing gold.

With this configuration, since Au is a material having a lower resistance than Pd, such a stacked structure can reduce the gate resistance. Moreover, since Au has a high resistance to etching by a chlorine gas or a fluorine gas in performing dry etching on the p-type third nitride semiconductor layer, it is possible to reduce deformation of the gate electrode.

In the semiconductor device of the present disclosure, the second nitride semiconductor layer may include a recessed portion formed in a formation region of the third nitride semiconductor layer, and at least a lower portion of the third nitride semiconductor layer may be in the recessed portion of the second nitride semiconductor layer.

With this configuration, the recessed portion formed in second nitride semiconductor layer in the formation region of the third nitride semiconductor layer reduces concentration of electric field on an end of the gate electrode facing the drain and an end of the third nitride semiconductor layer facing the drain. Thus, the third nitride semiconductor layer formed in the recessed portion in the second nitride semiconductor layer can reduce the current collapse due to the concentration of the electric field, and can prevent the breakdown of the device.

A method for fabricating a first semiconductor device according to the present disclosure includes: sequentially forming a first nitride semiconductor layer, a second nitride semiconductor layer, and a third nitride semiconductor layer having a p-type conductivity on a substrate; selectively forming a gate electrode on the third nitride semiconductor layer; removing the third nitride semiconductor layer in a self-alignment manner by using the formed gate electrode as a mask to leave a portion of the third nitride semiconductor layer under the gate electrode; annealing the second nitride semiconductor layer and the left portion of the third nitride semiconductor layer in a nitrogen atmosphere; and forming a source electrode and a drain electrode on regions the second nitride semiconductor layer laterally outward of the gate electrode.

According to the method for fabricating the first semiconductor device, it is possible to form the width of the gate electrode in the gate length direction to be substantially equal to the width of the third nitride semiconductor layer in the gate length direction. Moreover, since an annealing step reduces damages caused in removing the third nitride semiconductor layer, it is possible to reduce the current collapse.

A method for fabricating a second semiconductor device according to the present disclosure includes: sequentially forming a first nitride semiconductor layer and a second nitride semiconductor layer on a substrate; selectively forming a recessed portion in a gate electrode formation region of an upper surface of the second nitride semiconductor layer; forming a p-type third nitride semiconductor layer on the second nitride semiconductor layer to fill at least the recessed portion; selectively forming a gate electrode on a region of the third nitride semiconductor layer covering the recessed portion; removing the third nitride semiconductor layer in a self-alignment manner by using the formed gate electrode as a mask to leave a portion of the third nitride semiconductor layer under the gate electrode; annealing the second nitride semiconductor layer and the left portion of the third nitride semiconductor layer in a nitrogen atmosphere; and forming a source electrode and a drain electrode on regions of the second nitride semiconductor layer laterally outward of the gate electrode.

According to the method for fabricating the second semiconductor device, in addition to the advantages obtained by the method for fabricating the first semiconductor device, the recessed portion selectively formed in the gate electrode formation region of the second nitride semiconductor layer can reduce concentration of electric field on an end of the gate electrode facing the drain and an end of the third nitride semiconductor layer facing the drain. Thus, the current collapse due to the concentration of the electric field can be reduced, and the breakdown of the device can be prevented.

In the method for fabricating the first or second semiconductor device, the gate electrode may be made of at least a material selected from the group consisting of tungsten silicide ($W_xSi_{1-x}$), rhenium silicide ($Re_xSi_{1-x}$), tantalum silicide ($Ta_xSi_{1-x}$), osmium silicide ($Os_xSi_{1-x}$), molybdenum silicide ($Mo_xSi_{1-x}$), where $0 < x < 1$, and indium tin oxide (ITO).

In the method for fabricating the first or second semiconductor device, the gate electrode may be made of at least a metal selected from the group consisting of tungsten (W), rhenium (Re), tantalum (Ta), osmium (Os), and molybdenum (Mo).

In the method for fabricating the first or second semiconductor device, the forming the gate electrode may include forming a metal layer in an upper portion of the gate electrode, the metal layer being made of gold or an alloy containing gold.

In the method for fabricating the first or second semiconductor device, the forming the gate electrode may include forming a first metal layer on an upper surface of the third nitride semiconductor layer, the first metal layer having a thickness of 20 nm or less and being made of palladium or an alloy containing palladium.

In the method for fabricating the first or second semiconductor device, the forming the gate electrode may include forming a second metal layer in an upper portion of the gate electrode, the second metal layer being made of gold or an alloy containing gold.

In the method for fabricating the first or second semiconductor device, an annealing temperature in the annealing in the nitrogen atmosphere may be higher than or equal to 650° C. and lower than or equal to 1100° C.

In the method for fabricating the first or second semiconductor device, an annealing temperature in the annealing in the nitrogen atmosphere may be higher than or equal to 650° C. and lower than or equal to 950° C.

With this configuration, the current collapse can be reduced without breaking down the gate electrode.

According to the semiconductor device and method for fabricating the same according to the present disclosure, a normally-off type semiconductor device made of nitride and having a p-type conductive layer provided under a gate electrode of the semiconductor device can be reduced in size, so that it is possible to reduce the channel resistance and reduce the current collapse.

BRIEF DESCRIPTION OF THE DRAWINGS

FIGS. 9A-9G are cross-sectional views sequentially illustrating steps in a method for fabricating the semiconductor device according to the second embodiment of the present disclosure.

DESCRIPTION

First Embodiment

For example, a field-effect transistor (junction field-effect transistor: JFET) which is a semiconductor device according to a first embodiment of the present disclosure will be described with reference to FIG. 1.

Figure 1:
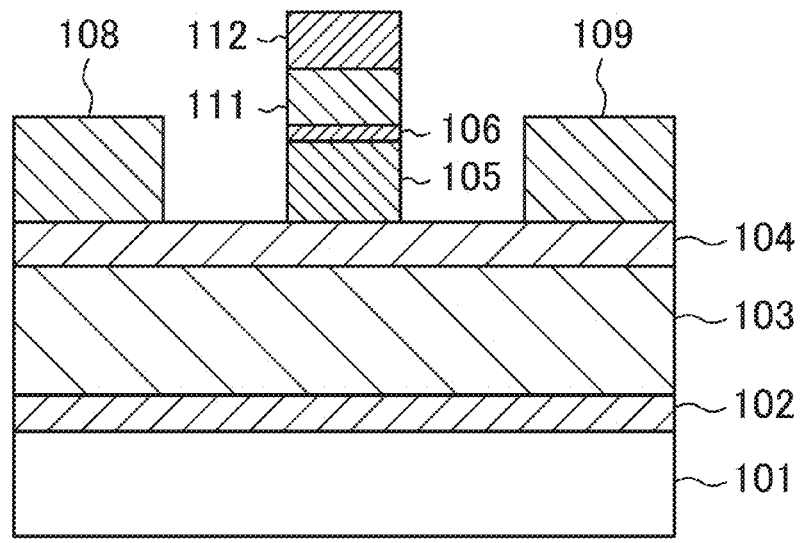
FIG. 1 is a cross-sectional view illustrating a semiconductor device according to a first embodiment of the present disclosure.

As illustrated in FIG. 1, the field-effect transistor according to the first embodiment includes a 100 nm-thick buffer layer 102 made of AlN, a 2 μm-thick channel layer 103 made of undoped GaN, a 20 nm-thick barrier layer 104 made of undoped AlGaN, a 100 nm-thick p-type GaN layer 105, and a 5 nm-thick p-type GaN layer 106 having a high concentration which are sequentially formed on a substrate 101 made of, for example, silicon (Si).

The p-type GaN layer 105 and the p-type GaN layer 106 having a high concentration are selectively etched to leave portions of the p-type GaN layer 105 and the p-type GaN layer 106 in a gate formation region and expose regions of the barrier layer 104 laterally outward of the left portions of the p-type GaN layer 105 and the p-type GaN layer 106. A gate electrode 111 made of indium tin oxide (ITO) and a gold (Au) electrode 112 are sequentially formed on the p-type GaN layer 106.

A source electrode 108 and a drain electrode 109 which are made of a multilayer film of, for example, titanium (Ti)/aluminum (Al) are formed on the regions of the barrier layer 104 laterally outward of the gate electrode 111 and the p-type GaN layer 105 in a gate length direction. Here, for example, $Al_{0.15}Ga_{0.85}N$ can be used for the barrier layer 104 made of undoped AlGaN. Note that as described above, the term "undoped semiconductor" means a semiconductor into which impurities determining the conductivity type are not implanted on purpose. The same applies to the following embodiments.

In order to reduce the expansion of a depletion layer to the p-type GaN layer 105, the carrier concentration of the p-type GaN layer 105 is preferably higher than or equal to $1\times10^{18}$ cm$^{-3}$. Moreover, the carrier concentration of the p-type GaN layer 106 having a high concentration is preferably higher than or equal to $2\times10^{18}$ cm$^{-3}$ when an ohmic contact to the gate electrode 111 is obtained.

The field-effect transistor according to the first embodiment includes the p-type GaN layers 105 and 106 between the gate electrode 111 and the barrier layer 104. This can increase the threshold voltage of a gate voltage within a positive value. Specifically, the density of carriers in the p-type GaN layer 105 and the Al composition and the dimension in a thickness direction of the barrier layer 104 are adjusted, and two dimensional electron gas concentration in a portion of the channel layer 103 under the gate electrode 111 is regulated, thereby obtaining a normally-off type transistor.

Figure 12:
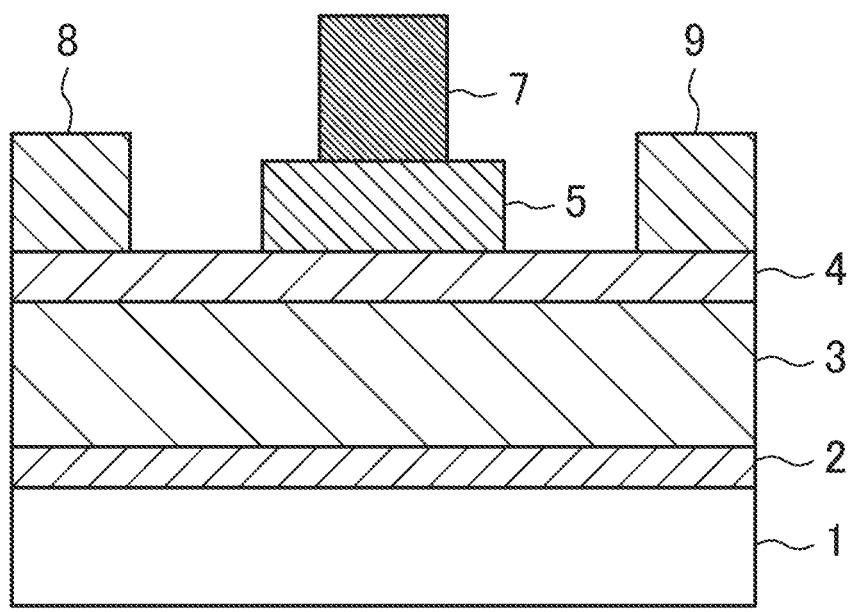
FIG. 12 is a cross-sectional view illustrating a semiconductor device (JFET) according to a first conventional example.
Figure 13A:
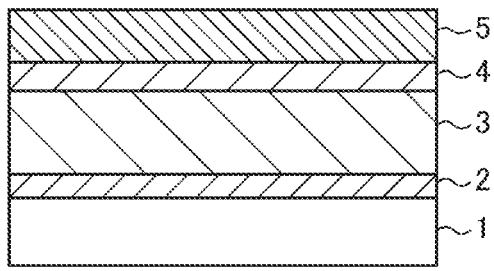
FIGS. 13A-13E are cross-sectional views sequentially illustrating steps in a method for fabricating the semiconductor device according to the first conventional example.
Figure 13B:
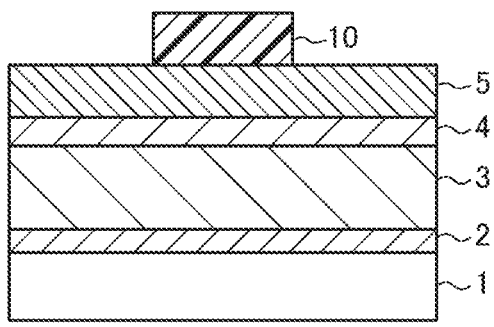
Figure 13C:
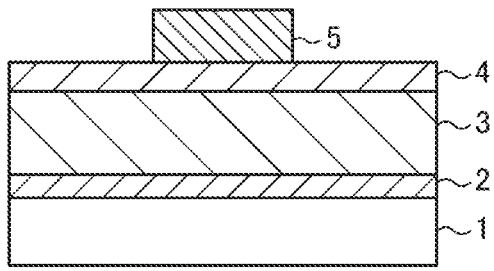
Figure 13D:
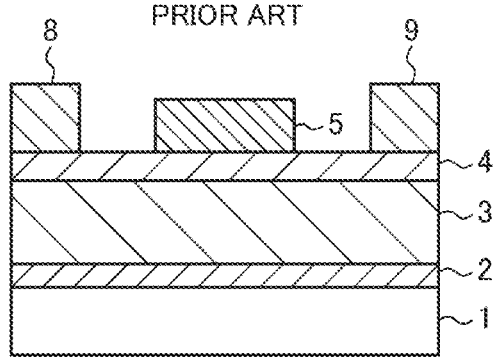
Figure 13E:
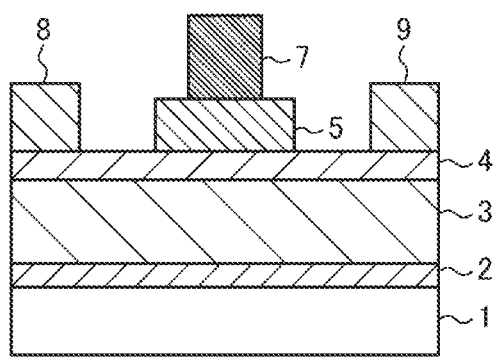
Figure 14:
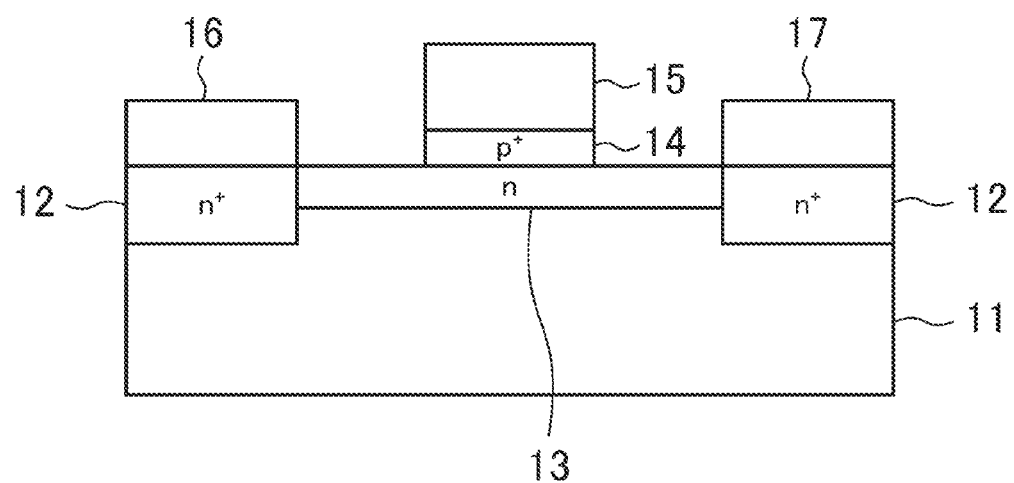
FIG. 14 is a cross-sectional view illustrating a semiconductor device (JFET) according to a second conventional example fabricated by a self-alignment process.

A first feature of the field-effect transistor according to the first embodiment is that the difference between the width of the gate electrode 111 and the width of the p-type GaN layer 105 is small compared to that in the first conventional example illustrated in FIG. 12, so that the gate electrode 111 and the source electrode 108 or the drain electrode 109 can be formed close to each other. With this configuration, the channel length can be reduced, thereby reducing the channel resistance (source resistance), so that it is possible to increase transconductance. Additionally, the device size is reduced, so that it is possible to increase the number of devices obtained per area.

A second feature of the field-effect transistor according to the first embodiment is that the constituent material of the gate electrode 111 has a high resistance to heat. Nickel (Ni), which has been conventionally used for gate electrodes, is a refractory material having a melting point higher than or equal to 1000° C. However, since Ni has poor adherence, a part of a gate electrode made of Ni peeled off when annealing was performed at a temperature higher than or equal to 700° C. When a multilayer film (Ni/Au electrode) of nickel (Ni) and gold (Au) is used, the adherence is improved, but the homology of a surface of the electrode is significantly degraded when the annealing temperature is higher than or equal to 600° C. When the annealing temperature was higher than or equal to 700° C., a part of an electrode made of the multilayer film of Ni and Au peeled off. Thus, a configuration using Ni as the gate electrode 111 has an insufficient resistance to heat at a temperature equal to or higher than 600° C.

Figure 2:
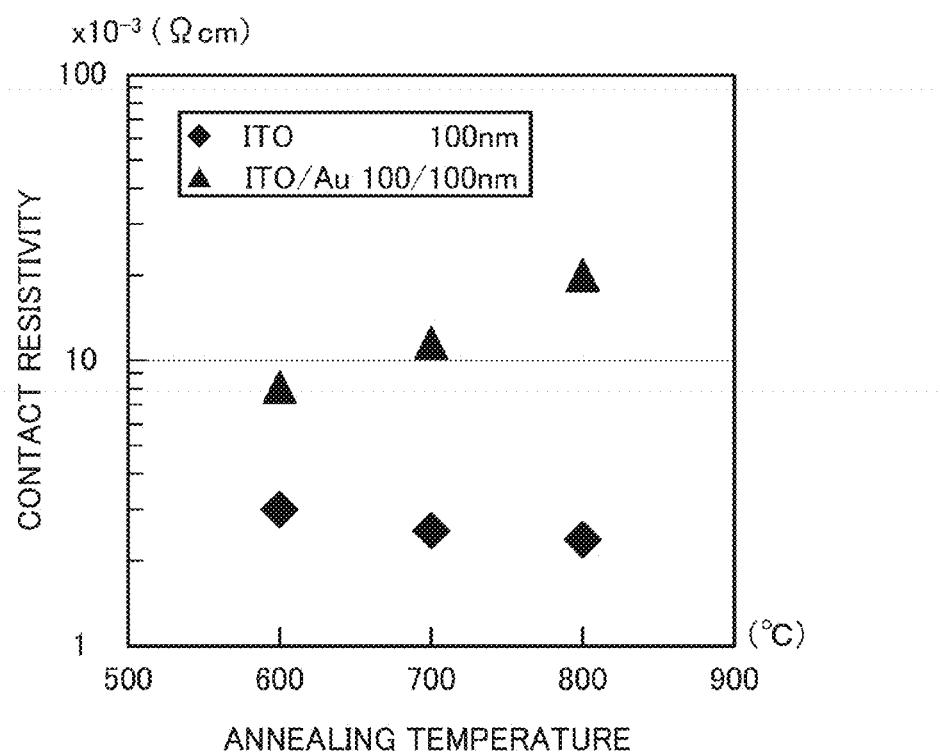
FIG. 2 is a graph illustrating annealing temperature dependency of the contact resistivity of p-type GaN and an ITO electrode and the contact resistivity of p-type GaN and an ITO/Au electrode of the semiconductor device according to the first embodiment of the present disclosure.

FIG. 2 illustrates annealing temperature dependency of the contact resistivity of the gate electrode structure according to the first embodiment. Specifically, FIG. 2 shows annealing temperature dependency of the contact resistivity of a configuration in which an electrode including only a 100 nm-thick ITO is used as the gate electrode (black triangle shape) and the contact resistivity of a configuration in which a stacked structure including a 100 nm-thick ITO and Au is used as the gate electrode (black diamond shape).

As can be seen from FIG. 2, even when annealing at a temperature higher than or equal to 600° C. was performed, an ohmic contact was obtained in both the configurations, and a sufficient resistance to heat was proved. Thus, even after portions of the p-type GaN layers 105 and 106 are removed by dry etching using the gate electrode 111 as a mask, the gate electrode 111 is not degraded by heat, and thus dry etching damage caused by high temperature annealing can be repaired. Note that it is not necessary that the p-type GaN layer 106 is in ohmic contact with the gate electrode 111. However, when the p-type GaN layer 106 is in ohmic contact with the gate electrode 111, a gate voltage controlling operation of the transistor can be reduced. Therefore, the p-type GaN layer 106 is preferably in ohmic contact with the gate electrode 111.

As described above, according to the field-effect transistor of the first embodiment, the device size can be reduced, and the current collapse can be reduced.

FIG. 3 illustrates the relationship between a drain voltage and a drain current before and after stress is applied by a pulse voltage in the field-effect transistor according to the first embodiment.

Figure 3A:
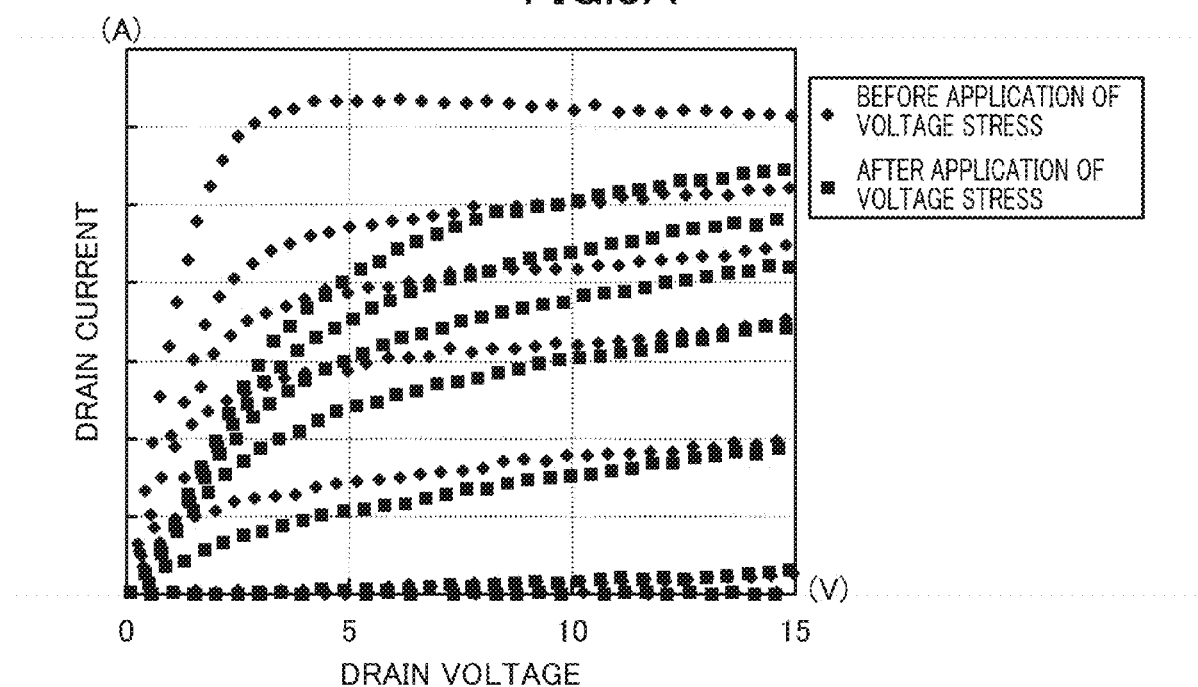
FIG. 3A is a graph illustrating drain currents and drain voltages before and after application of voltage stress, where the p-type conductive layer is not annealed after etching according to a comparative example.
Figure 3B:
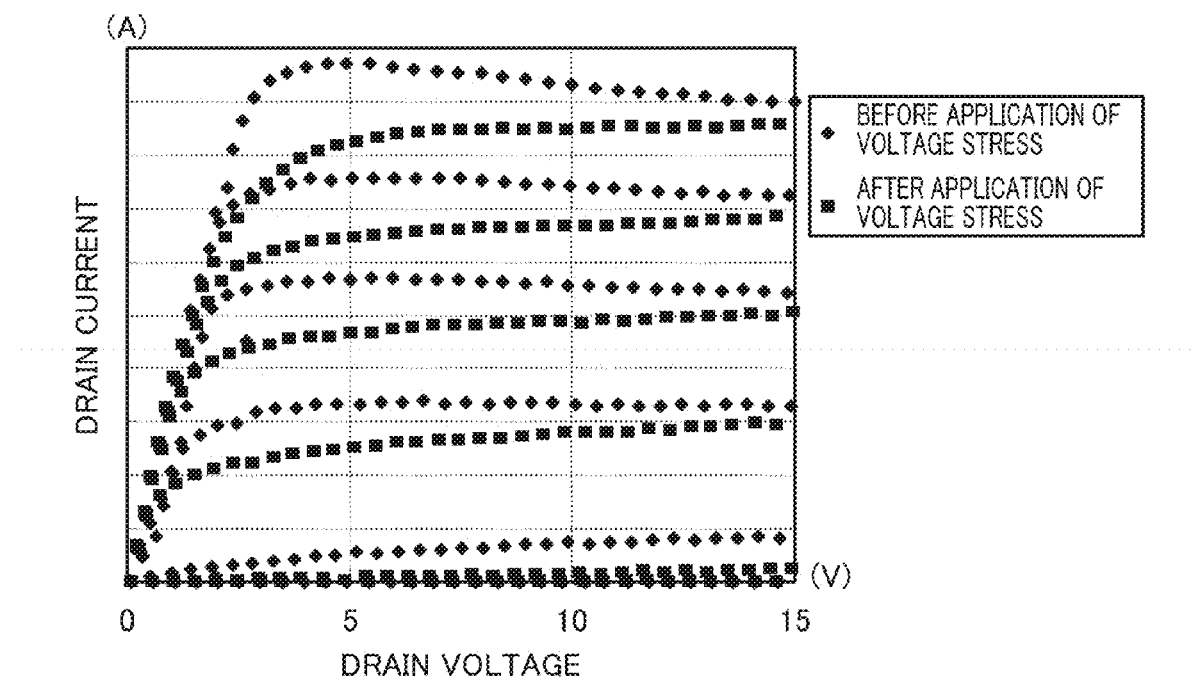
FIG. 3B is a graph illustrating drain currents and drain voltages before and after application of voltage stress, where the p-type conductive layer of the semiconductor device is annealed after etching according to the first embodiment of the present disclosure.

FIG. 3A illustrates transistor characteristics obtained when annealing is not performed after removal of the p-type GaN layer according to a comparative example. FIG. 3B illustrates transistor characteristics obtained when annealing is performed in a nitrogen ($N_2$) atmosphere at 800° C. for 20 minutes after removal of the p-type GaN layer according to the present disclosure. In the comparative example of FIG. 3A, it can be seen that a drain current after application of voltage stress (black square) is significantly lower than that before application of voltage stress (black diamond shape), and so-called current collapse occurs. In contrast, in the present disclosure of FIG. 3B in which high temperature annealing is performed, reduction of the drain current after application of voltage stress (black square) is small, and the current collapse is reduced.

—Fabrication Method—

A method for fabricating a field-effect transistor having the above-described configuration will be described hereinafter with reference to FIGS. 4A-4E.

Figure 4A:
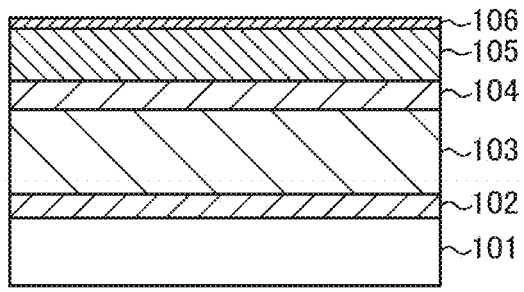
FIGS. 4A-4E are cross-sectional views sequentially illustrating steps in a method for fabricating the semiconductor device according to the first embodiment of the present disclosure.

First, as illustrated in FIG. 4A, for example, by molecular beam epitaxy (MBE) or metal organic chemical vapor deposition (MOCVD), a 100 nm-thick buffer layer 102 made of AlN, a 2 μm-thick channel layer 103 made of undoped GaN, a 20 nm-thick barrier layer 104 made of undoped AlGaN, a 100 nm-thick p-type GaN layer 105, and a 5 nm-thick p-type GaN layer 106 having a high concentration are sequentially formed on a substrate 101 made of Si by epitaxial growth. Note that a material for the substrate 101 may be, but not limited to, silicon (Si). For example, a substrate made of a material, such as sapphire (monocrystalline $Al_2O_3$), silicon carbide (SiC), or gallium nitride (GaN), which allows epitaxial growth of a nitride semiconductor may be used.

Next, a 2-layer-structure resist film (not shown) is formed on the p-type GaN layer 106 by lithography. The 2-layer-structure resist film has an opening pattern exposing a gate electrode formation region. Subsequently, for example, a 100 nm-thick ITO film and a 100 nm-thick Au film are stacked over the entire surface of the resist film by sputtering, vacuum evaporation, or the like. Then, the resist film and the metal films formed on the resist film are removed by lift-off processing. In this way, as illustrated in FIG. 4B, a gate electrode 111 is made of the ITO film, and an Au electrode 112 is made of the Au film on the gate electrode 111.

Figure 4D:
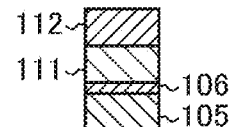
Figure 4B:
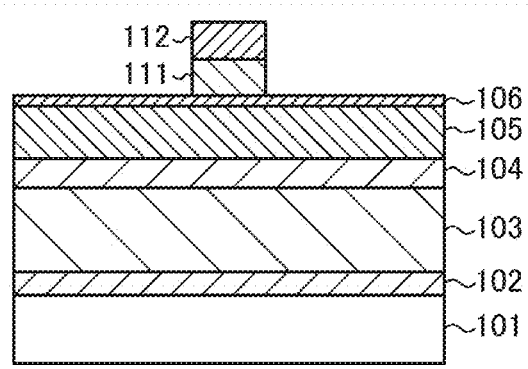
Figure 4C:
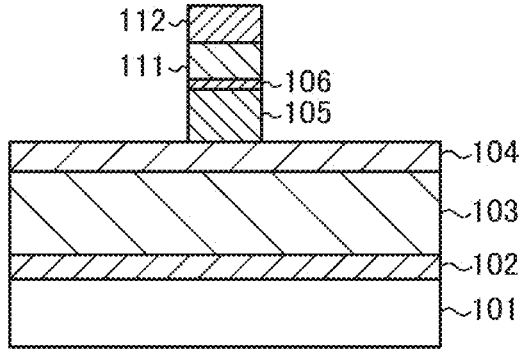

Next, as illustrated in FIG. 4C, dry etching using a fluorine-based or chlorine-based gas is performed on the p-type GaN layers 105 and 106 by using the Au electrode 112 and the gate electrode 111 as a mask. In this way, the p-type GaN layers 105 and 106, except their portions under the gate electrode 111, are removed.

Next, as illustrated in FIG. 4D, high temperature annealing is performed on the substrate 101 provided with the Au electrode 112, the gate electrode 111, and the patterned p-type GaN layers 105 and 106, for example, in a nitrogen ($N_2$) atmosphere at a temperature of 800° C. for 20 minutes. Here, in order to repair damage to the barrier layer 104 made of AlGaN caused by the etching, the annealing temperature is preferably higher than or equal to 650° C. Moreover, to reduce desorption of nitrogen from AlGaN, annealing is preferably performed in a nitrogen atmosphere. Note that at a high temperature higher than or equal to 1100° C., desorption of nitrogen from GaN or AlGaN increases, thereby degrading device characteristics. Therefore, annealing is preferably performed at a temperature lower than or equal to 1100° C. When the Au electrode 112 is formed on the gate electrode 111, annealing is preferably performed at a temperature lower than or equal to 1050° C. because the melting point of Au is 1064° C. When ITO is used for the gate electrode 111, annealing is preferably performed at a temperature lower than or equal to 950° C. because the melting point of the ITO is 980° C.

Figure 4E:
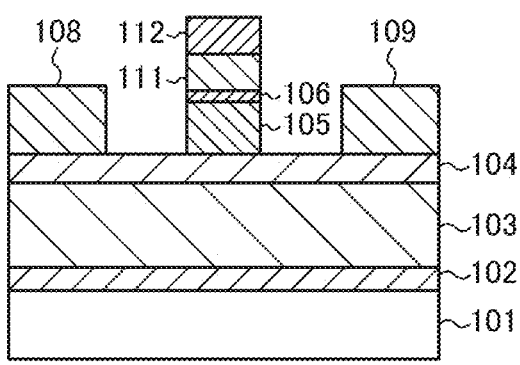

Next, a 2-layer structure resist film (not shown) having an opening pattern is formed on the barrier layer 104 by lithography, the opening pattern covering at least the Au electrode 112 and exposing formation regions in which a source electrode and a drain electrode will be formed. Subsequently, a multilayer film made of, for example, Ti/Al is formed over the entire surface of the resist film by sputtering, vacuum evaporation, or the like. After that, the resist film and the multilayer film formed on the resist film are removed by lift-off processing. In this way, as illustrated in FIG. 4E, a source electrode 108 and a drain electrode 109 each made of the Ti/Al film are formed. Subsequently, the metals forming the gate electrode 111, the source electrode 108, and the drain electrode 109, and the nitride semiconductor layers are subjected to an alloying process in an infrared alloying furnace or a heat alloying furnace. A field-effect transistor according to the first embodiment can thus be fabricated.

A first feature of the method for fabricating the field-effect transistor according to the first embodiment is that the p-type GaN layers 105 and 106, except their portions in the gate formation region, are removed by using the gate electrode 111 and the Au electrode 112 together as a mask. In this way, a difference between the width of the p-type GaN layers 105 and 106 in the gate length direction and the width of the gate electrode 111 in the gate length direction can be reduced compared to the case where the gate electrode 111 is formed by lift-off processing on the gate formation region of the p-type GaN layers 105 and 106 which have been formed. As a result, the distance between the gate electrode 111 and the source electrode 108 or the drain electrode 109 can be reduced. Note that, the difference between the width of the gate electrode 111 in the gate length and the width of the p-type GaN layers 105 and 106 in the gate length is smaller than or equal to 0.2 µm. Although the difference between the width of the gate electrode 111 in the gate length direction and the width of the p-type GaN layers 105 and 106 in the gate length direction depends on constituent materials of the gate electrode 111, there are only a few cases where the difference is larger than 0.2 µm when the p-type GaN layers 105 and 106 are etched in a self-alignment manner using the gate electrode 111 as a mask.

A second feature of the method for fabricating the field-effect transistor according to the first embodiment is that annealing is performed at a high temperature after the p-type GaN layers 105 and 106, except their portions in the gate formation region, are removed. This can repair damage such as a crystal defect formed by dry etching on or in the vicinity of a surface of the barrier layer 104 made of AlGaN.

Thus, when the method for fabricating the semiconductor device according to the present embodiment is used, the device size can be reduced, and the current collapse can be reduced.

Although indium tin oxide (ITO) is used for the gate electrode 111 in the first embodiment, a material for the gate electrode 111 is not limited to ITO. Instead of ITO, for example, at least one material selected from the group consisting of tungsten silicide ($W_xSi_{1-x}$), rhenium silicide ($Re_xSi_{1-x}$), tantalum silicide ($Ta_xSi_{1-x}$), osmium silicide ($Os_xSi_{1-x}$), and molybdenum silicide ($Mo_xSi_{1-x}$), where $0<x<1$, may be used. Since these materials are materials having a high adhesion similar to ITO, it is possible to further reduce peeling off of the gate electrode 111 from the p-type GaN layer 106.

Variation of First Embodiment

Figure 5:
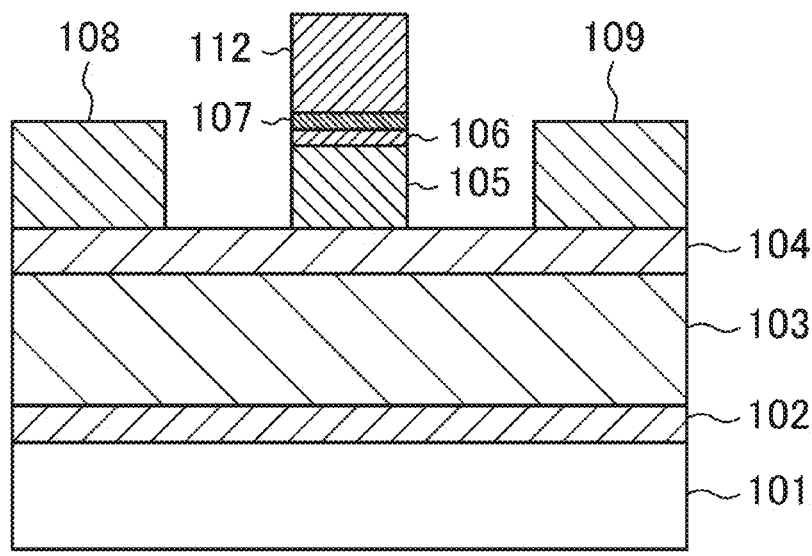
FIG. 5 is a cross-sectional view illustrating a semiconductor device according to a variation of the first embodiment of the present disclosure.

A field-effect transistor of a variation of the first embodiment according to the present disclosure will be described hereinafter with reference to FIG. 5. In FIG. 5, the same reference numerals as those shown in FIG. 1 are used to represent equivalent elements and the explanation thereof will be omitted.

As illustrated in FIG. 5, the field-effect transistor according to the present variation uses palladium (Pd) as a constituent material of a gate electrode 107 formed on p-type GaN layers 105 and 106.

Figure 6:
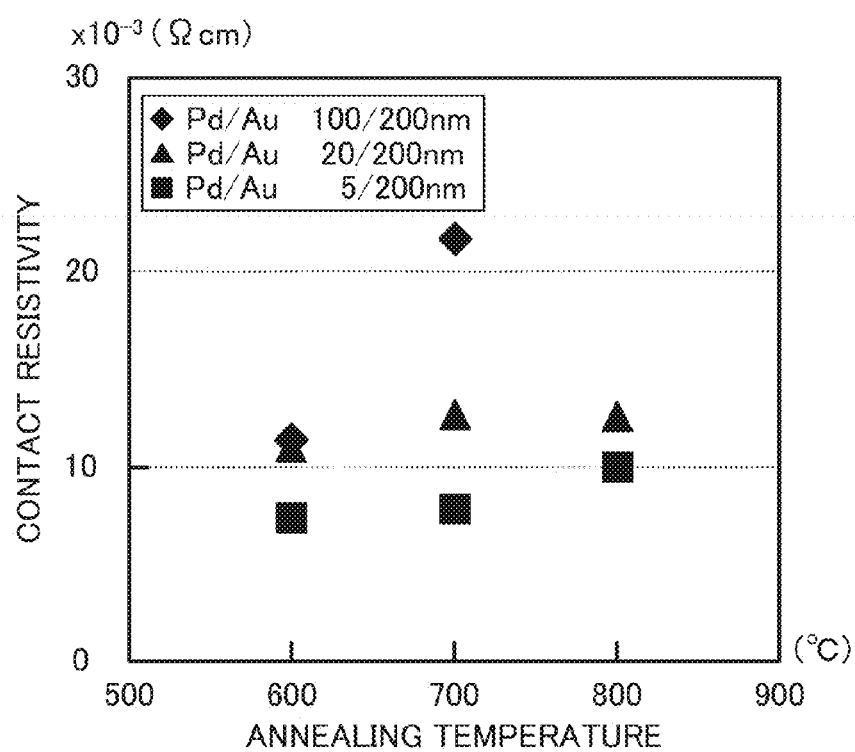
FIG. 6 is a graph illustrating dependency of the contact resistances of p-type GaN and Pd/Au electrodes of the semiconductor devices on the thickness of Pd films and the annealing temperature according to the variation of the first embodiment of the present disclosure.

FIG. 6 illustrates dependency of the contact resistivities of p-type GaN and Pd/Au electrodes on the thickness of Pd films of the Pd/Au electrodes and the annealing temperature. Note that when the thickness of the Pd film is 100 nm, a part of the electrode peeled off due to annealing at a temperature of 800° C., and thus it was not possible to measure the current-voltage characteristic. Therefore, the case where the thickness of the Pd film is 100 nm is not plotted on the graph. It can be seen from FIG. 6 that when Pd is used as a gate electrode 107, the thickness of the Pd film is preferably smaller than or equal to 20 nm.

Figure 7:
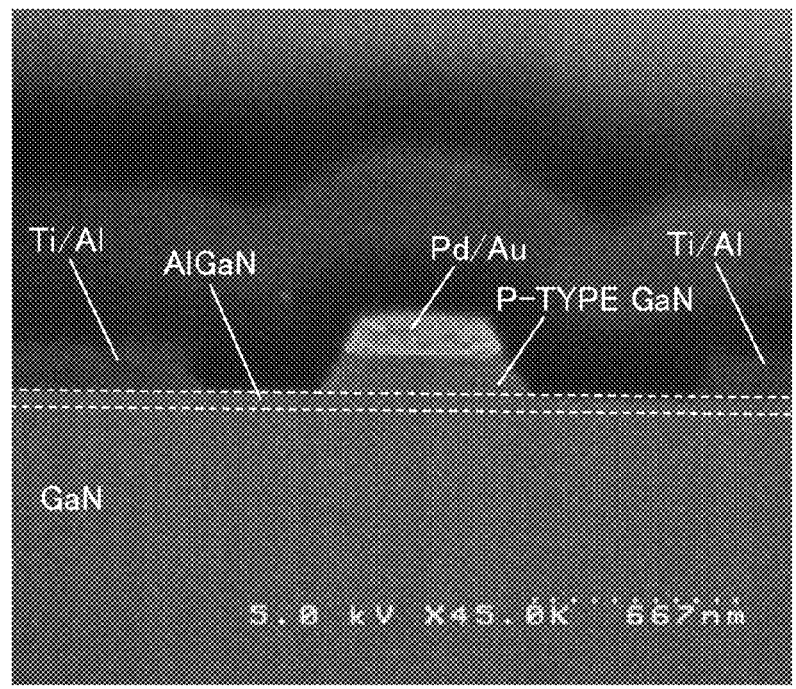
FIG. 7 is a SEM micrograph illustrating a cross section of the semiconductor device according to the variation of the first embodiment of the present disclosure.

FIG. 7 shows a micrograph taken along a cross section of the field-effect transistor according to the present variation by a scanning electron microscope (SEM). It can be seen FIG. 7 that the difference between the width of an upper surface of the p-type GaN layer in the gate length direction and the width of the gate electrode in the gate length direction is less than or equal to 0.2 µm. Here, the thickness of the Pd/Au electrode is less than or equal to 0.22 µm.

When a stacked structure including the gate electrode 107 and a Au electrode 112 formed on the gate electrode 107 is considered to be a gate electrode, for example, side etching of Pd further progresses compared to that of Au depending on etching conditions of dry etching in the field-effect transistor according to the present variation, so that there is a case where the width of an upper surface of the p-type GaN layer 106 is not equal to the width of a lower surface of the gate electrode 107. In this case, the etching condition is changed, for example, such that a bias output of an inductively coupled plasma (ICP) device is increased, so that it is possible to reduce the difference between the width of the p-type GaN layer 106 and the width of the gate electrode 107 at an interface between the p-type GaN layer 106 and the p-type GaN layer 106.

Moreover, before performing dry etching, annealing at a temperature of, for example, 400° C. is performed on the Pd/Au electrode to form an alloy containing Pd on the p-type GaN layers 105 and 106. Then, the progress of the side etching may be stopped.

With these procedures, the width difference between the p-type GaN layers 105 and 106 and the gate electrode 107 can be reduced to 0.2 μm or less.

Note that the alloy containing Pd is, as described above, an alloy containing Pd as a constituent element of the electrode, and includes a mixture in which part of Pd of an electrode material is not alloyed.

Second Embodiment

Figure 8:
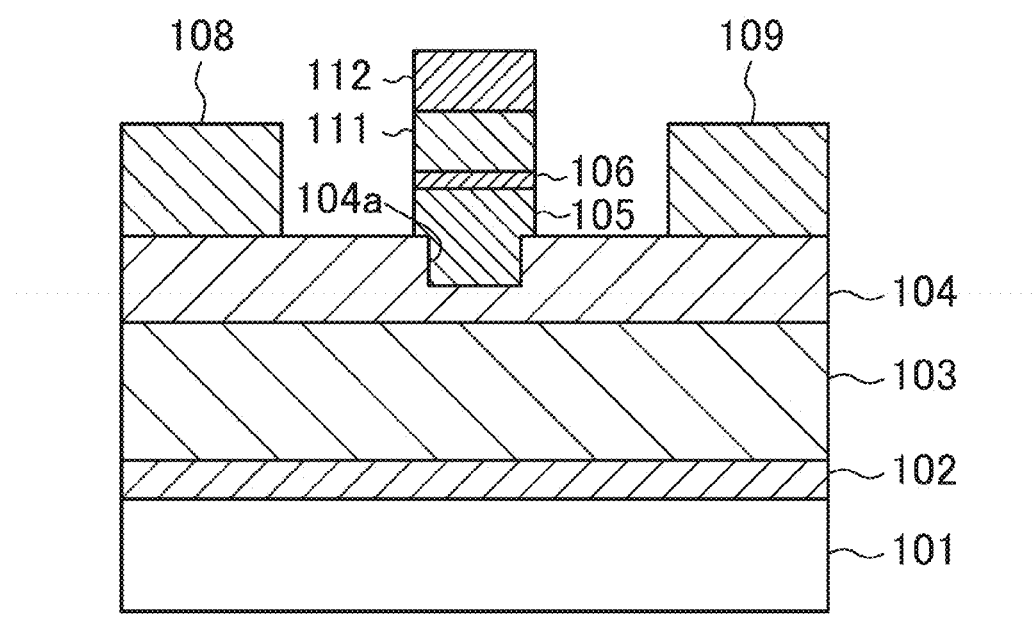
FIG. 8 is a cross-sectional view illustrating a semiconductor device according to a second embodiment of the present disclosure.

For example, a field-effect transistor which is a semiconductor device according to a second embodiment of the present disclosure will be described hereinafter with reference to FIG. 8. In FIG. 8, the same reference numerals as those shown in FIG. 1 are used to represent equivalent elements, and the explanation thereof will be omitted.

The field-effect transistor according to the second embodiment includes a barrier layer 104 made of undoped AlGaN to have a thickness of 50 nm and having a recessed portion 104a. On an upper surface of the bather layer 104, a p-type GaN layer 105, a source electrode 108, and a drain electrode 109 are formed. In the recessed portion 104a, a lower portion of the p-type GaN layer 105 is buried.

Here, the thickness of the p-type GaN layer 105 whose lower portion is buried in the recessed portion 104a of the barrier layer 104, that is, the height from the lower surface to the upper surface of the p-type GaN layer 105, is 100 nm. A 5 nm-thick p-type GaN layer 106 having a high concentration is formed on the p-type GaN layer 105, and a gate electrode 111 made of ITO and a Au electrode 112 are sequentially formed on the p-type GaN layer 106.

Similar to the first embodiment, the p-type GaN layers 105 and 106 of the field-effect transistor according to the second embodiment are provided between the barrier layer 104 and the gate electrode. With this configuration, the threshold voltage of a gate voltage can be increased within a positive value.

Moreover, in the second embodiment, in addition to the carrier density in the p-type GaN layer 105 and the Al composition and the dimension in the thickness direction of the barrier layer, the depth of the recessed portion 104a is adjusted, and the two dimensional electron gas concentration in a portion of a channel layer 103 under the gate electrode 111 is regulated, thereby obtaining a normally-off type transistor.

A first feature of the field-effect transistor according to the second embodiment is that the difference between the width of the gate electrode 111 and the width of the p-type GaN layer 105 is small compared to that in the case of the first conventional example illustrated in FIG. 12, so that the gate electrode 111 and the source electrode 108 or the drain electrode 109 can be formed close to each other. With this configuration, the channel length can be reduced, thereby reducing the channel resistance (source resistance), so that it is possible to increase transconductance. Additionally, the device size is reduced, so that it is possible to increase the number of devices obtained per area.

A second feature of the field-effect transistor according to the second embodiment is that the constituent material of the gate electrode 111 has a high resistance to heat. As described later, even after the p-type GaN layers 105 and 106 are patterned by dry etching using the gate electrode 111 as a mask, the gate electrode 111 is not deteriorated by annealing, so that damage to the bather layer 104 caused by dry etching can be repaired by high temperature annealing.

Similar to the first embodiment, it is not necessary that the p-type GaN layer 106 is in ohmic contact with the gate electrode 111. However, when the p-type GaN layer 106 is in ohmic contact with the gate electrode 111, a gate voltage controlling operation of the transistor can be reduced. Therefore, the p-type GaN layer 106 is preferably in ohmic contact with the gate electrode 111.

A third feature of the field-effect transistor according to the second embodiment is that the recessed portion 104a in which the lower portion of the p-type GaN layer 105 is buried is provided in a region of the barrier layer 104 under the gate electrode 111, so that it is possible to reduce concentration of the electric field on an end of the gate electrode 111 facing the drain electrode 109 or an end of the p-type GaN layer 105 facing the drain electrode 109. With this configuration, current collapse due to the concentration of the electric field on an end of the recessed portion 104a in the barrier layer 104 facing the drain electrode 109 can be reduced, or the breakdown of the device can be prevented.

—Fabrication Method—

A method for fabricating the field-effect transistor having the above-described configuration will be described hereinafter with reference to FIGS. 9A-9G.

First, as illustrated in FIG. 9A, for example, by MBE or MOCVD, a 100 nm-thick buffer layer 102 made of AlN, a 2 μm-thick channel layer 103 made of undoped GaN, and a 50 nm-thick bather layer 104 made of undoped $Al_{0.15}Ga_{0.85}N$ are sequentially formed on a substrate 101 made of Si by epitaxial growth.

Next, a resist film (not shown) is formed on the bather layer 104 by lithography. The resist film has an opening pattern exposing a formation region of a recessed portion 104a. Using the formed resist film as a mask, dry etching is performed on the barrier layer 104 by using a fluorine-based or a chlorine-based gas, thereby obtaining the state illustrated in FIG. 9B.

Next, as illustrated in FIG. 9C, MBE or MOCVD is performed again such that a 100 nm-thick p-type GaN layer 105 and a 5 nm-thick p-type GaN layer 106 filling at least the recessed portion 104a are sequentially formed on the barrier layer 104 by epitaxial growth.

Next, a 2-layer-structure resist film (not shown) is formed on the p-type GaN layer 106 by lithography. The 2-layer-structure resist film has an opening pattern exposing a gate electrode formation region. Subsequently, for example, a 100 nm-thick ITO film and a 100 nm-thick Au film are formed over the entire surface of the resist film by sputtering, vacuum evaporation, or the like. Then, the resist film and the metal films formed on the resist film are removed by lift-off processing. In this way, as illustrated in FIG. 9D, a gate electrode 111 is made of the ITO film, and an Au electrode 112 is made of the Au film on the gate electrode 111.

Next, as illustrated in FIG. 9E, dry etching using a fluorine-based or chlorine-based gas is performed on the p-type GaN layers 105 and 106 by using the Au electrode 112 and the gate electrode 111 as a mask. In this way, the p-type GaN layers 105 and 106, except their portions under the gate electrode 111, are removed.

Next, as illustrated in FIG. 4D, high temperature annealing is performed on the substrate 101 provided with the Au electrode 112, the gate electrode 111, and the patterned p-type GaN layers 105 and 106, for example, in a nitrogen ($N_2$) atmosphere at a temperature of 800° C. for 20 minutes. In order to repair damage to the barrier layer 104 made of AlGaN caused by the etching, the annealing temperature is preferably higher than or equal to 650° C. Moreover, to reduce desorption of nitrogen from AlGaN, annealing is preferably performed in a nitrogen atmosphere. Note that at a high temperature higher than or equal to 1100° C., desorption of nitrogen from GaN or AlGaN increases, thereby degrading device characteristics. Therefore, annealing is preferably performed at a temperature lower than or equal to 1100° C. When the Au electrode 112 is formed on the gate electrode 111, annealing is preferably performed at a temperature lower than or equal to 1050° C. because the melting point of Au is 1064° C.

Next, a 2-layer structure resist film (not shown) having an opening pattern is formed on the barrier layer 104 by lithography, the opening pattern covering at least the Au electrode 112 and exposing formation regions in which a source electrode and a drain electrode will be formed. Subsequently, a multilayer film made of, for example, Ti/Al is formed over the entire surface of the resist film by sputtering, vacuum evaporation, or the like. After that, the resist film and the multilayer film formed on the resist film are removed by lift-off processing. In this way, as illustrated in FIG. 9G, a source electrode 108 and a drain electrode 109 each made of the Ti/Al film are formed. Subsequently, the metals forming the gate electrode 111, the source electrode 108, and the drain electrode 109, and the nitride semiconductor layers are subjected to an alloying process in an infrared alloying furnace or a heat alloying furnace. A field-effect transistor according to the second embodiment can thus be fabricated.

A first feature of the method for fabricating the field-effect transistor according to the second embodiment is that the p-type GaN layers 105 and 106, except their portions in the gate formation region, are removed by using the gate electrode 111 and the Au electrode 112 together as a mask. In this way, a difference between the width of the p-type GaN layers 105 and 106 in the gate length direction and the width of the gate electrode 111 in the gate length direction can be reduced compared to the case where the gate electrode 111 is formed by lift-off processing on the gate formation region of the p-type GaN layers 105 and 106 which have been formed. As a result, the distance between the gate electrode 111 and the source electrode 108 or the drain electrode 109 can be reduced. Note that, the difference between the width of the gate electrode 111 in the gate length and the width of the p-type GaN layers 105 and 106 in the gate length is smaller than or equal to 0.2 μm. Although the difference between the width of the gate electrode 111 in the gate length direction and the width of the p-type GaN layers 105 and 106 in the gate length direction depends on constituent materials of the gate electrode 111, there are only a few cases where the difference is larger than 0.2 μm when the p-type GaN layers 105 and 106 are etched in a self-alignment manner using the gate electrode 111 as a mask.

A second feature of the method for fabricating the field-effect transistor according to the second embodiment is that a high temperature annealing is performed after the p-type GaN layers 105 and 106, except their portions in the gate formation region, are removed. This can repair damage such as a crystal defect formed by dry etching on or in the vicinity of a surface of the barrier layer 104 made of AlGaN.

A third feature of the method for fabricating the field-effect transistor according to the second embodiment is that the recessed portion 104a in which the lower portion of the p-type GaN layer 105 is buried is provided in a region of the barrier layer 104 under the gate electrode 111, so that it is possible to reduce concentration of the electric field on an end of the gate electrode 111 facing the drain electrode 109 or an end of the p-type GaN layer 105 facing the drain electrode 109. With this configuration, the current collapse due to the concentration of the electric field on an end of the recessed portion 104a in the barrier layer 104 facing the drain electrode 109 can be reduced, or the breakdown of the device can be prevented.

Thus, when the method for fabricating the semiconductor device according to the present embodiment is used, the device size can be reduced, and the current collapse can be reduced.

Although ITO is also used for the gate electrode 111 in the second embodiment, a material for the gate electrode 111 is not limited to ITO. Instead of ITO, for example, at least one material selected from the group consisting of tungsten silicide ($W_xSi_{1-x}$), rhenium silicide ($Re_xSi_{1-x}$), tantalum silicide ($Ta_xSi_{1-x}$), osmium silicide ($Os_xSi_{1-x}$), and molybdenum silicide ($Mo_xSi_{1-x}$, where 0<x<1 may be used. Since these materials are materials having a high adhesion similar to ITO, it is possible to further reduce peeling off of the gate electrode 111 from the p-type GaN layer 106.

Third Embodiment

Figure 10:
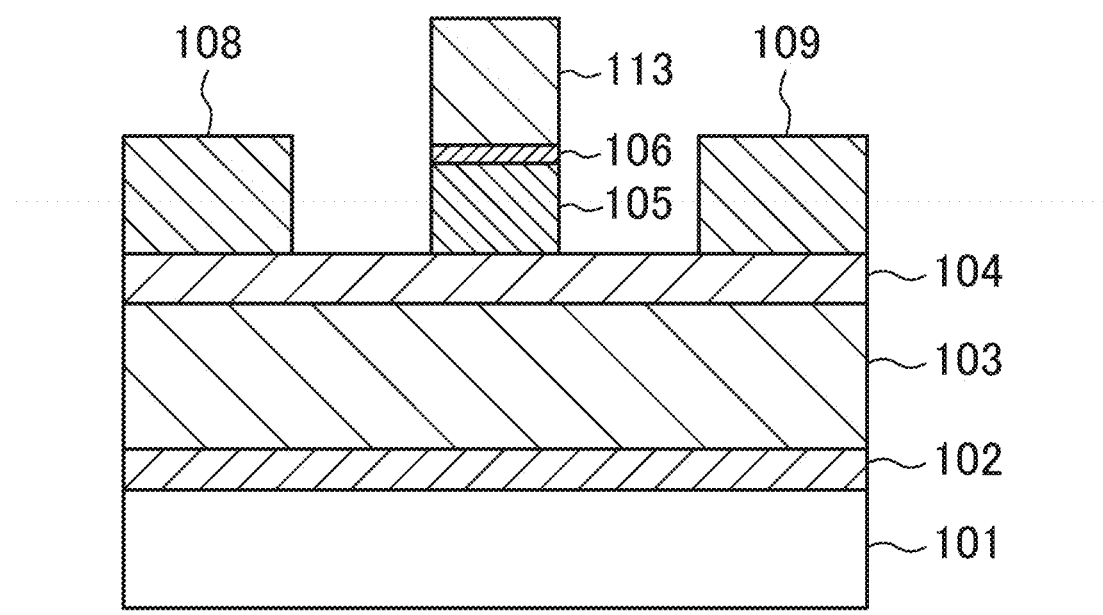
FIG. 10 is a cross-sectional view illustrating a semiconductor device according to a third embodiment of the present disclosure.

For example, a field-effect transistor which is a semiconductor device according to a third embodiment of the present disclosure will be described hereinafter with reference to FIG. 10. In FIG. 10, the same reference numerals as those shown in FIG. 1 are used to represent equivalent elements, and the explanation thereof will be omitted.

In the field-effect transistor according to the third embodiment, tungsten (W) which is a refractory material having a particularly high melting point is used as a constituent material of a gate electrode 113 formed on p-type GaN layers 105 and 106.

The field-effect transistor according to the third embodiment includes the p-type GaN layers 105 and 106 between the gate electrode 113 and a barrier layer 104. This can increase the threshold voltage of a gate voltage within a positive value. Specifically, the density of carriers in the p-type GaN layer 105 and the Al composition and the dimension in a thickness direction of the barrier layer 104 are adjusted, and two dimensional electron gas concentration in a portion of a channel layer 103 under the gate electrode 113 is regulated, thereby obtaining a normally-off type transistor.

A first feature of the field-effect transistor according to the third embodiment is that the difference between the width of the gate electrode 113 and the width of the p-type GaN layer 105 is small compared to that in the first conventional example illustrated in FIG. 12, so that the gate electrode 113 and a source electrode 108 or a drain electrode 109 can be formed close to each other. With this configuration, the channel length can be reduced, thereby reducing the channel resistance (source resistance), so that it is possible to increase transconductance. Additionally, the device size is reduced, so that it is possible to increase the number of devices obtained per area.

A second feature of the field-effect transistor according to the third embodiment is that the constituent material of the gate electrode 113 has a high resistance to heat. As described later, even after the p-type GaN layers 105 and 106 are patterned by dry etching using the gate electrode 113 as a mask, the gate electrode 113 is not deteriorated by annealing, so that damage to the bather layer 104 caused by dry etching can be repaired by high temperature annealing.

Similar to the first embodiment, it is not necessary that the p-type GaN layer 106 is in ohmic contact with the gate electrode 113. However, when the p-type GaN layer 106 is in ohmic contact with the gate electrode 113, a gate voltage controlling operation of the transistor can be reduced. Therefore, the p-type GaN layer 106 is preferably in ohmic contact with and the gate electrode 113.

—Fabrication Method—

A method for fabricating a field-effect transistor having the above-described configuration will be described hereinafter with reference to FIGS. 11A-11F.

Figure 11A:
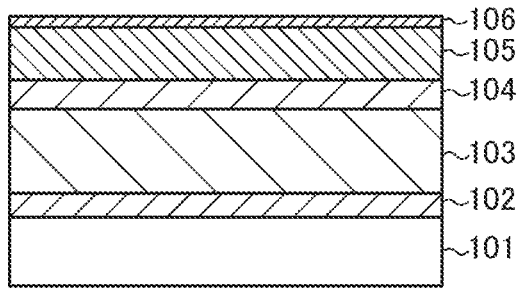
FIGS. 11A-11F are cross-sectional views sequentially illustrating steps in a method for fabricating the semiconductor device according to the third embodiment of the present disclosure.

First, as illustrated in FIG. 11A, for example, by MBE or MOCVD, a 100 nm-thick buffer layer 102 made of AlN, a 2 μm-thick channel layer 103 made of undoped GaN, a 20 nm-thick bather layer 104 made of undoped $Al_{0.15}Ga_{0.85}N$, a 100 nm-thick p-type GaN layer 105, and a 5 nm-thick p-type GaN layer 106 having a high concentration are sequentially formed on a substrate 101 made of Si by epitaxial growth.

Figure 11D:
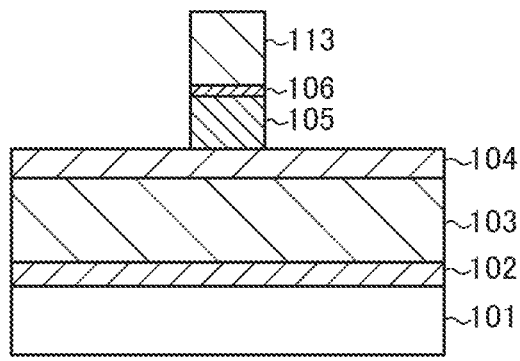
Figure 11B:
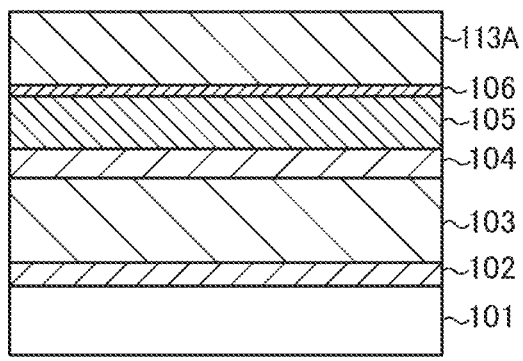

Next, as illustrated in FIG. 11B, a 100 nm-thick tungsten (W) film 113A is formed on the p-type GaN layer 106 by sputtering.

Next, a resist film (not shown) masking a gate electrode formation region is formed on the W film 113A by lithography. Subsequently, using the formed resist film as a mask, dry etching is performed on the W film 113A by using a fluorine-based or chlorine-based gas. In this way, as illustrated in FIG. 11C, a gate electrode 113 is formed from the W film 113A. Note that as a gate electrode formation mask, a 100 nm-thick electrode made of an electrode material less susceptible to etching by a fluorine-based or chlorine gas, e.g., gold (Au) may be formed instead of the resist film by lift-off processing. In this case, similar to the field-effect transistor of FIG. 1, a Au electrode is formed on the gate electrode 113.

Next, as illustrated in FIG. 11D, dry etching using a fluorine-based or chlorine-based gas is performed on the p-type GaN layers 105 and 106 by using the gate electrode 113 as a mask. In this way, the p-type GaN layers 105 and 106, except their portions under the gate electrode 113, are removed.

Figure 11E:
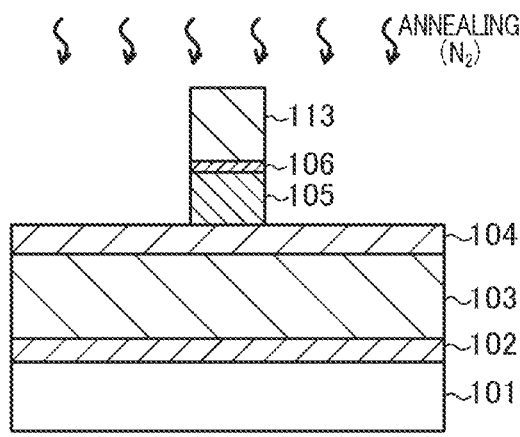
Figure 11C:
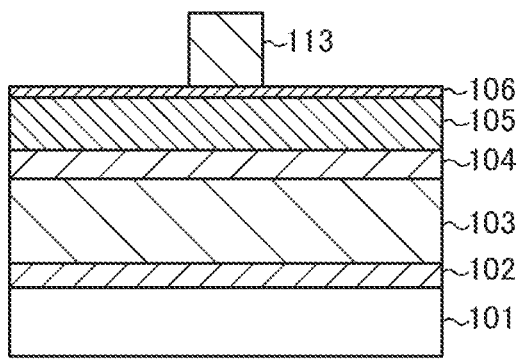

Next, as illustrated in FIG. 11E, high temperature annealing is performed on the substrate 101 provided with the gate electrode 113 and the patterned p-type GaN layers 105 and 106, for example, in a nitrogen atmosphere at a temperature of 800° C. for 20 minutes. Here, in order to repair damage to the barrier layer 104 made of AlGaN caused by the etching, the annealing temperature is preferably higher than or equal to 650° C. Moreover, to reduce desorption of nitrogen from AlGaN, annealing is preferably performed in a nitrogen atmosphere. Note that at a high temperature higher than or equal to 1100° C., desorption of nitrogen from GaN or AlGaN increases, thereby degrading device characteristics. Therefore, annealing is preferably performed at a temperature lower than or equal to 1100° C. When an Au electrode is formed on the gate electrode 113, annealing is preferably performed at a temperature lower than or equal to 1050° C.

Figure 11F:
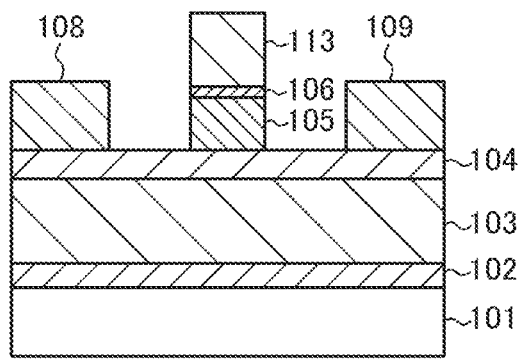

Next, a 2-layer structure resist film (not shown) having an opening pattern is formed on the barrier layer 104 by lithography, the opening pattern covering at least the gate electrode 113 and exposing formation regions in which a source electrode and a drain electrode will be formed. Subsequently, a multilayer film made of, for example, Ti/Al is formed over the entire surface of the resist film by sputtering, vacuum evaporation, or the like. After that, the resist film and the multilayer film formed on the resist film are removed by lift-off processing. In this way, as illustrated in FIG. 11F, a source electrode 108 and a drain electrode 109 each made of the Ti/Al film are formed. Subsequently, the metals forming the gate electrode 113, the source electrode 108, and the drain electrode 109, and the nitride semiconductor layers are subjected to an alloying process in an infrared alloying furnace or a heat alloying furnace. A field-effect transistor according to the third embodiment can thus be fabricated.

A first feature of the method for fabricating the field-effect transistor according to the third embodiment is that the p-type GaN layers 105 and 106, except their portions in the gate formation region, are removed by using the gate electrode 113 as a mask. In this way, a difference between the width of the p-type GaN layers 105 and 106 in the gate length direction and the width of the gate electrode 113 in the gate length direction can be reduced compared to the case where the gate electrode 111 is formed by lift-off processing on the gate formation region of the p-type GaN layers 105 and 106 which have been formed. As a result, the distance between the gate electrode 113 and the source electrode 108 or the drain electrode 109 can be reduced. Note that, the difference between the width of the gate electrode 113 in the gate length and the width of the p-type GaN layers 105 and 106 in the gate length is smaller than or equal to 0.2 μm. Although the difference between the width of the gate electrode 113 in the gate length direction and the width of the p-type GaN layers 105 and 106 in the gate length direction depends on constituent materials of the gate electrode 113, there are only a few cases where the difference is larger than 0.2 μm when the p-type GaN layers 105 and 106 are etched in a self-alignment manner using the gate electrode 113 as a mask.

A second feature of the method for fabricating the field-effect transistor according to the third embodiment is that a high temperature annealing is performed after portions of the p-type GaN layers 105 and 106 are removed except portions of the p-type GaN layers 105 and 106 in the gate formation region. This can repair damage such as a crystal defect formed by dry etching on or in the vicinity of a surface of the bather layer 104 made of AlGaN.

Thus, when the method for fabricating the semiconductor device according to the present embodiment is used, the device size can be reduced, and the current collapse can be reduced.

Although tungsten (W) is used for the gate electrode 113 in the third embodiment, a material for the gate electrode 113 is not limited to W. Instead of W, for example, at least one material selected from the group consisting of rhenium (Re), tantalum (Ta), osmium (Os), and molybdenum (Mo) may be used.

Moreover, the variation of the first embodiment and the third embodiment may have a configuration in which a lower portion of the p-type GaN layer 105 is buried in a recessed portion 104a of the barrier layer 104.

What is claimed is:
1. A semiconductor device comprising:
a first nitride semiconductor layer including a channel region;
a second nitride semiconductor layer formed on the first nitride semiconductor layer, the second nitride semiconductor layer having a larger band gap than the first nitride semiconductor layer;
a third nitride semiconductor layer selectively formed on the second nitride semiconductor layer, the third nitride semiconductor layer having a p-type conductivity;
a fourth nitride semiconductor layer formed on the third nitride semiconductor layer, the fourth nitride semiconductor layer having p-type conductivity and a higher carrier concentration than the third nitride semiconductor layer;

a gate electrode formed on the fourth nitride semiconductor layer, the gate electrode being made of a refractory material; and
a source electrode and a drain electrode formed on regions of the second nitride semiconductor layer laterally outward of the gate electrode, wherein
a width of the gate electrode in a gate length direction is smaller than a width of the third nitride semiconductor layer in the gate length direction, and
a difference between the width of the gate electrode in the gate length direction and the width of the third nitride semiconductor layer in the gate length direction is less than or equal to 0.2 μm,
wherein the gate electrode has a lower portion being in contact with the fourth nitride semiconductor layer, and including a first metal layer, the first metal layer being made of an alloy containing palladium,
the first metal layer has a thickness of 20 nm or less, and
the gate electrode has an upper portion includes a second metal layer made of gold or an alloy containing gold.

2. The semiconductor device of claim 1, wherein
the second nitride semiconductor layer includes a recessed portion formed in a formation region of the third nitride semiconductor layer, and
at least a lower portion of the third nitride semiconductor layer is in the recessed portion of the second nitride semiconductor layer.

3. The semiconductor device of claim 1, wherein the fourth nitride semiconductor layer is in ohmic contact with the gate electrode.

* * * * *